(12) United States Patent
Morich et al.

(10) Patent No.: US 8,378,677 B2
(45) Date of Patent: Feb. 19, 2013

(54) THERMALLY STABILIZED PET DETECTOR FOR HYBRID PET-MR SYSTEM

(75) Inventors: Michael A. Morich, Mentor, OH (US); Gordon D. Demeester, Wickliffe, OH (US); Jerome J. Griesmer, Mentor, OH (US); Torsten J. Solf, Aachen (DE); Volkmar Schulz, Wuerselen (DE); Bjoern Weissler, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 520 days.

(21) Appl. No.: 12/667,573

(22) PCT Filed: Jun. 23, 2008

(86) PCT No.: PCT/IB2008/052477
§ 371 (c)(1),
(2), (4) Date: Jan. 4, 2010

(87) PCT Pub. No.: WO2009/004521
PCT Pub. Date: Jan. 8, 2009

(65) Prior Publication Data
US 2010/0188082 A1    Jul. 29, 2010

Related U.S. Application Data

(60) Provisional application No. 61/027,043, filed on Feb. 8, 2008, provisional application No. 60/947,483, filed on Jul. 2, 2007.

(51) Int. Cl.
*G01V 3/00*    (2006.01)

(52) U.S. Cl. .................................................. 324/307
(58) Field of Classification Search ........... 324/300–322
See application file for complete search history.

(56) References Cited

U.S. PATENT DOCUMENTS

| | | | |
|---|---|---|---|
| 6,812,705 B1 | 11/2004 | Sellers | |
| 7,626,389 B2 * | 12/2009 | Fiedler et al. | 324/309 |
| 7,719,277 B2 * | 5/2010 | Eberler et al. | 324/318 |
| 7,728,590 B2 * | 6/2010 | Eberler et al. | 324/318 |
| 7,847,553 B2 * | 12/2010 | Schon et al. | 324/318 |

(Continued)

FOREIGN PATENT DOCUMENTS

| | | |
|---|---|---|
| DE | 102006037047 A1 | 2/2008 |
| DE | 102007009180 A1 | 8/2008 |

(Continued)

*Primary Examiner* — Dixomara Vargas

(57) ABSTRACT

In a hybrid PET-MR system, PET detector elements (30) are added in the bore (14), in close proximity to the gradient coils (16). Fluid coolant is supplied to transfer heat from the PET detector elements (30). Thermal insulation (80) insulates the fluid coolant and the PET detector elements (30) from the gradient coils (16). In some embodiments, a first coolant path (90) is in thermal communication with the electronics, a second coolant path (92) is in thermal communication with the light detectors, and a thermal barrier (94, 96) is arranged between the first and second coolant paths such that the first and second coolant paths can be at different temperatures ($T_e$, $T_d$). In some embodiments a sealed heat pipe (110) is in thermal communication with a heat sink such that working fluid in the heat pipe undergoes vaporization/condensation cycling to transfer heat from the detector elements to the heat sink.

19 Claims, 8 Drawing Sheets

U.S. PATENT DOCUMENTS

| | | | |
|---|---|---|---|
| 8,018,717 B2 * | 9/2011 | Corbeil et al. | 361/699 |
| 8,102,178 B2 * | 1/2012 | Stocker | 324/318 |
| 8,131,340 B2 * | 3/2012 | Eberlein et al. | 600/411 |
| 8,188,736 B2 * | 5/2012 | Schulz et al. | 324/309 |
| 8,193,811 B2 * | 6/2012 | Tropp et al. | 324/318 |
| 2004/0075059 A1 | 4/2004 | Serebryanov et al. | |
| 2004/0217292 A1 | 11/2004 | Moyers et al. | |
| 2005/0030028 A1 | 2/2005 | Clarke et al. | |
| 2005/0067579 A1 | 3/2005 | Tsuchiya et al. | |
| 2006/0065848 A1 | 3/2006 | Ueno et al. | |
| 2006/0241386 A1 | 10/2006 | Yanagita et al. | |
| 2008/0068017 A1 | 3/2008 | Eberler et al. | |
| 2008/0208032 A1 | 8/2008 | Schuster et al. | |

FOREIGN PATENT DOCUMENTS

| | | |
|---|---|---|
| EP | 1219971 A2 | 7/2002 |
| EP | 1642530 A1 | 4/2006 |
| JP | 08045026 A | 2/1996 |
| WO | 2006071922 A2 | 7/2006 |
| WO | 2006111869 A2 | 10/2006 |

\* cited by examiner

THERMALLY STABILIZED PET DETECTOR FOR HYBRID PET-MR SYSTEM

CROSS REFERENCE TO RELATED APPLICATIONS

This application claims the benefit of U.S. provisional application Ser. No. 60/947,483 filed Jul. 2, 2007 and U.S. provisional application Ser. No. 61/027,043 filed Feb. 8, 2008, both of which are incorporated herein by reference.

The present application relates to the diagnostic imaging arts. It finds particular application with hybrid positron emission tomography-magnetic resonance (PET-MR) systems where the PET detector elements are in close proximity to heat-generating elements of the MR system, and will be described with particular reference thereto. As the PET detector elements themselves also produce heat, the present application is not limited to hybrid systems, but can be used in standalone PET systems, PET/CT (computed tomography) systems, or nuclear medicine systems other than PET, such as single photon emission computed tomography (SPECT) systems.

In a bore-type MRI system, a large solenoidal main magnet produces a magnetic field along the axis of the bore. Generally, the closer that the main magnet is to the imaging region, the more cost effective is the design. Travelling inward from the main magnet are typically gradient coils, shim coils (sometimes built into the gradient coil assembly), a radio frequency (RF) shield, and RF coils. These coils, or MR bore components, take up more space. So even before a PET detector system is introduced into the bore of the MR system, space is at a premium. The PET detector is necessarily in close proximity to the MR bore components. PET-MR systems can also be built with a vertical field open MR system. The same space limitations apply to this type of system.

The gradient coils especially produce large amounts of heat. During MR scanning, the gradient coils dissipate on average about 15 kW with higher peak levels. This can cause the gradient coils to increase in temperature and water cooling may be used to limit their temperature to about 70° C. The RF coils also generate heat. RF coils and gradient coils also generate stray fields when pulsed and this time-varying stray field may interact with metal components of the PET detector, such as purpose-built RF shielding, and produce additional heat.

The PET detector elements, which generate heat on their own, are typically air cooled. As the light detectors are sensitive to heat (dark noise doubles about every 10° C. increase in temperature), cooling to a temperature below the operating temperature of the gradient coils, to which they are in such close proximity, limits dark noise. But cooling in a PET-MR hybrid system is a problem because space is at such a premium. The density of heat generating elements inside the main magnet is very high, while space available for cooling systems is minimal.

The present application provides a new and improved cooling system for PET elements within the bore of an MR apparatus that overcomes the above-referenced problems and others.

In accordance with one aspect, a diagnostic imaging apparatus is provided. A magnetic resonance portion includes a main magnetic coil, a gradient coil assembly, and an RF coil assembly. The main magnetic coil generates a main magnetic field in an imaging region of the apparatus. The gradient coil assembly overlays gradient magnetic fields on the main magnetic field. Shim coils may be located within and/or near the gradient coil assembly. Shim coils overlay correction magnetic fields to improve the homogeneity of the main magnetic field, inclusive of subject, in vivo, perturbations of the main magnetic field. The RF coil assembly at least transmits RF signals into the imaging region. A positron emission tomography portion includes a fluid cooled detector array for detecting radiation indicative of nuclear decay events. The detector array is thermally proximate to the gradient coil assembly and is maintained at a lower temperature than the thermally proximate gradient coil assembly by fluid cooling of the fluid cooled detector array. At least one reconstruction processor produces an image representation from detected signals originating from the imaging region. A display displays the reconstructed image representation.

In accordance with another aspect, a method of diagnostic imaging is provided. A main magnetic field is produced in an imaging region. Gradient fields are overlaid on the main magnetic field. Additional shim fields may also be overlaid. Magnetic resonance is induced in a subject in the imaging region. The magnetic resonance is detected. A radiopharmaceutical is introduced into the subject, generally, sometime prior to the diagnostic imaging scan. Radiation indicative of radioactive decay events are detected with a detector array. The detector array is cooled with a fluid coolant. At least one of the detected magnetic resonance and the radiation is reconstructed into an image representation of the subject. The image representation is displayed. It is to be appreciated that other orders for these steps are equally viable and have been contemplated.

In accordance with another aspect, a radiation detector is disclosed, comprising: scintillators; light detectors arranged to detect scintillations generated in the scintillators by interaction with radiation of interest; electronics configured to receive and process electrical signals indicative of radiation of interest received from the light detectors; a first coolant path in thermal communication with the electronics and configured to transmit flowing coolant fluid; a second coolant path in thermal communication with the light detectors and configured to transmit flowing coolant fluid; and a thermal barrier arranged between the first and second coolant paths such that the first and second coolant paths can be at different temperatures.

In accordance with another aspect, an imaging system is disclosed, comprising: a first modality imaging system defining a bore and configured to acquire first modality imaging data from inside the bore; and a positron emission tomography (PET) imaging system including a generally annular array of radiation detectors as set forth in the immediately preceding paragraph arranged coaxially with the bore of the first modality imaging system.

In accordance with another aspect, a radiation detector is disclosed, comprising: scintillators; light detectors arranged to detect scintillations generated in the scintillators by interaction with radiation of interest; electronics configured to receive and process electrical signals indicative of radiation of interest received from the light detectors; a heat sink; and a sealed heat pipe in thermal communication with the heat sink and the light detectors. The sealed heat pipe contains a working fluid and a wicking material or structure configured such that the working fluid undergoes vaporization/condensation cycling within the sealed heat pipe to transfer heat from the light detectors to the heat sink.

In accordance with another aspect, an imaging system is disclosed, comprising: a magnetic resonance scanner defining a bore and configured to acquire magnetic resonance data from inside the bore; and a positron emission tomography (PET) imaging system including a generally annular array of radiation detectors as set forth in the immediately preceding paragraph arranged coaxially with the bore to acquire PET data from inside the bore.

One advantage lies in improved cooling for PET detector elements.

Another advantage lies in compact cooling of the detector elements.

Another advantage lies in independent cooling systems for the gradient coils and the PET detector elements.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
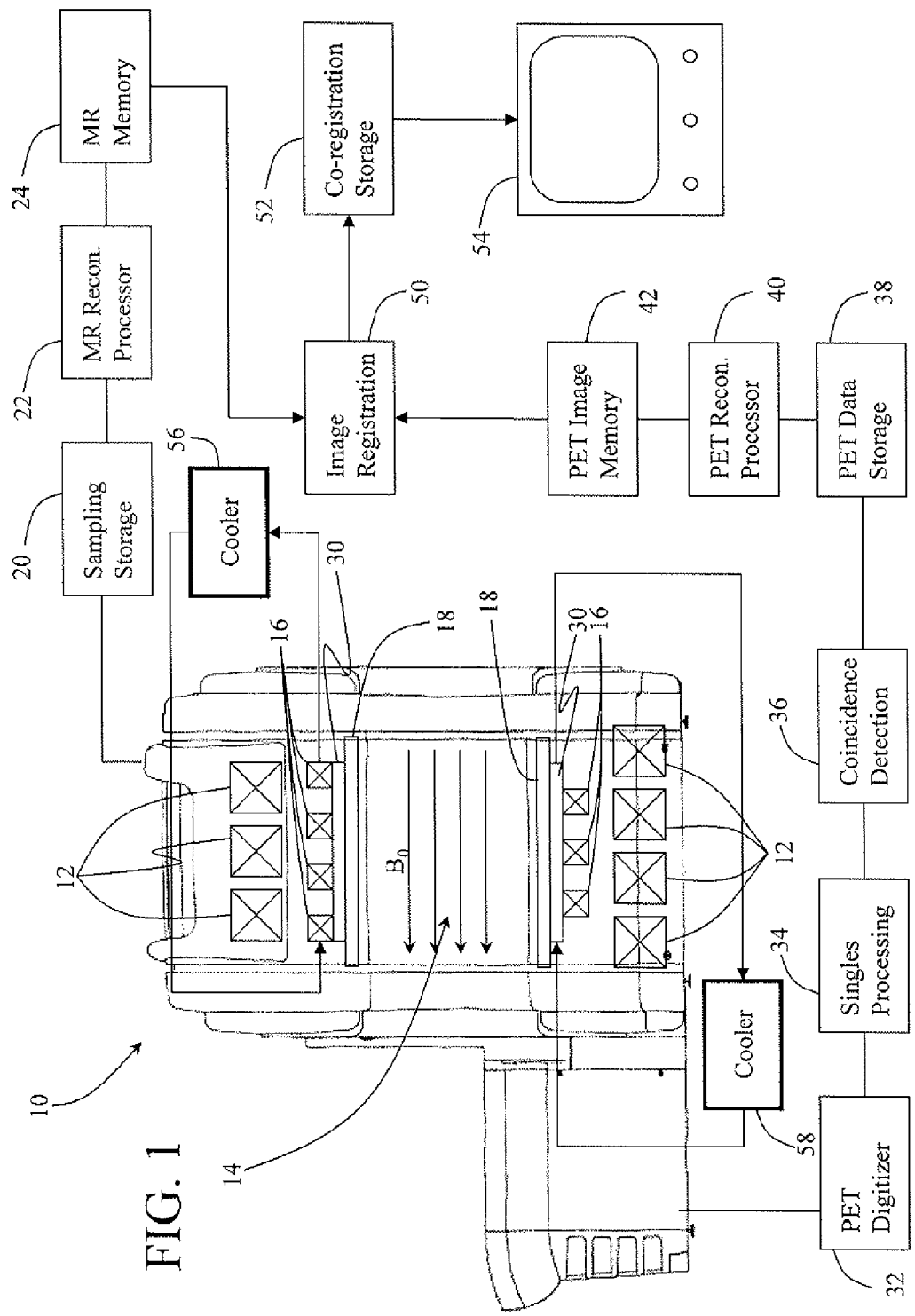
FIG. 1 is a diagrammatic illustration of a combined PET/MR scanner, in accordance with the present application.

With reference to FIG. 1, an embodiment of a combined or hybrid magnetic resonance (MR) and PET data acquisition system 10 is depicted. The combined or hybrid system 10 is capable of acquiring both MR data and PET data, for example from MR and PET spatial regions that are at least partially overlapping (as illustrated) or spatially adjacent. It is to be understood that a multimodality system is ideal for temporally and spatially aligning or registering images; images taken from different scanners that are remotely located or spatially displaced are also contemplated, and similarly viable. The illustrated scanner 10 is an integrated system, but other scanner orientations are equally plausible, such as side-by-side systems, insert systems, and the like. The magnetic resonance scanner shown includes an annular magnet 12 including a plurality of conductor coil windings (diagrammatically depicted in FIG. 1 by boxes with crossing lines) that generate a static magnetic field $B_0$ within an imaging region 14. The magnet 12 may be superconducting or resistive in nature; in the former case the magnet 12 is typically disposed in a cryogenic dewar or other cooling system (not shown). The illustrated magnet 12 is a solenoidal magnet having a relatively horizontal $B_0$ field through the imaging region 14. Though the polarity of the $B_0$ field is shown right to left, the opposite polarity is also suitable. In other embodiments, the magnet 12 may have a C or other configuration oriented to produce a vertical or otherwise oriented static magnetic field.

The magnetic resonance scanner also includes a magnetic field gradient assembly, which in the illustrative embodiment of FIG. 1 includes gradient coil windings 16 that cooperatively superimpose magnetic field gradients on the static $B_0$ magnetic field responsive to selective energizing of selected gradient coil windings 16. Optionally, the magnetic field gradient coil, magnet, or both may include other features not shown for forming, stabilizing, and dynamically adjusting the magnetic field, such as passive ferromagnetic shims, active shimming coils, and the like. The magnetic resonance scanner further includes a radio frequency excitation and reception system 18. The radio frequency system includes at least one component, such as an illustrated whole body radio frequency coil 18, that can be energized at a suitable radio frequency to excite magnetic resonance in a subject disposed in the imaging region 14. The coil 18 can also operate as a radio frequency receiver to receive or detect magnetic resonance emanating from the imaging region 14 after RF excitation. In some embodiments, different coils are used for the excitation and reception operations. For example, the built-in coil 18 may be used to excite magnetic resonance, and a different, local coil or dedicated receive coil (not shown) may be positioned over, on, or close to the subject in the imaging region 14 to detect magnetic resonance. It is contemplated for the same magnetic resonance scanner to be configurable in different ways using different combinations of built-in coils, local coils, or both.

Received magnetic resonance samples are stored in a magnetic resonance sampling storage 20. A magnetic resonance reconstruction processor 22 applies a suitable reconstruction algorithm to reconstruct the magnetic resonance samples to form a reconstructed image that is stored in a magnetic resonance image memory 24. The reconstruction processor 22 applies a reconstruction algorithm that comports with the selected spatial encoding used in generating the magnetic resonance data. For example, a Fourier transform reconstruction algorithm may be suitable for reconstructing Cartesian encoded magnetic resonance data. Optionally, part of the MR reconstruction may be done in-line, before data storage and completion of reconstruction.

With continuing reference to FIG. 1, the illustrated combined or hybrid MR and PET data acquisition system 10 further includes radiation detectors for performing PET data acquisition. In the illustrative example of FIG. 1, an annular array of radiation detectors 30 encircles the bore of the hybrid system. As will be described below, the illustrated array 30 includes a scintillator layer and a layer of electron multiplier based photon detectors, however, other detector configurations such as planar detector arrays disposed about the imaging region 14 are contemplated. Solid state radiation detectors and solid state optical detectors are also contemplated. The radiation detector array 30 is configured to detect 511 keV gamma rays that are emitted by positron-electron annihilation events. In PET data acquisition, two substantially simultaneous 511 keV gamma ray detection events are presumed to have originated from the same positron-electron annihilation event, which is located somewhere along a "line of response" (LOR) connecting the two substantially simultaneous 511 keV gamma ray detection events. This line of response is also sometimes called a projection or a ray, and the collected PET data is referred to as projection data.

In conventional PET, substantially simultaneous 511 keV gamma ray detection events are defined as two 511 keV gamma ray detection events occurring within a selected short time window, such as within four nanoseconds of each other. Any positron annihilation that does not occur at the center of the field of view (FOV) will have a small difference in time of arrival at the opposing detector elements, proportional to the difference in travel times for the gamma rays, about four nanoseconds at the edge of the FOV. A related technique, called time-of-flight PET or TOF-PET, takes advantage of this small time difference to further localize the positron-electron annihilation event along the LOR with sub nanosecond precision.

The radiation detector array 30 of the hybrid system 10 is used to acquire PET or TOF-PET data. The gamma ray detection events are processed by a PET digitization unit 32 that performs time-to-digital conversion (TDC) and analog-to-digital conversion (ADC) of detection events, and a singles processing unit 34 that performs clustering, energy estimation, time stamping, and positioning. The singles processing unit 34 optionally filters out detections that are outside of a selection energy window for the expected 511 keV gamma ray energy. In some embodiments, the radiation detectors are pixelated. In other embodiments, clustering is applied by a block readout algorithm such as Anger logic or the like to provide further spatial localization refinement of the gamma ray detection events defining the projection. A coincidence detection processor 36 employs temporal windowing to identify gamma ray detection events that occurred substantially simultaneously, and hence likely correspond to a common positron-electron annihilation event and hence define a projection or line of response.

For TOF processing, the time difference between the identified substantially simultaneous or coincident detection events is used to spatially estimate the positron-electron annihilation event along the line of response.

The resulting PET or TOF-PET data are stored in a PET data storage 38. It is to be understood that the PET data could be stored before or after coincidence determination. A PET reconstruction processor 40 processes the projection or localized projection data using a suitable reconstruction algorithm to generate a reconstructed image that is stored in a PET images storage 42. For example, maximum-likelihood expectation maximization (ML-EM), a filtered backprojection algorithm or iterative reconstruction algorithm other than ML-EM can be employed. The system of FIG. 1 includes a continuous radiation detector array 30 for PET that completely encircles the subject. Incomplete encirclement can lead to imaging artifacts due to "missing" projections or lines of response. For example, certain projections can be missed, and so information ordinarily provided by such projections about related positions is unavailable. Advantageously, if time-of-flight PET data are acquired and reconstructed then the time-of-flight localization provides additional information that compensates for lost information even in the presence of incomplete encirclement. There are, however, other ways of compensating for incomplete encirclement, and other detector configurations are certainly contemplated in the present application.

The MR and PET acquisitions are optionally performed concurrently. Alternatively or additionally, MR and PET acquisition can be done sequentially (e.g., MR first followed by PET, or vice versa) or can be interleaved. An image registration processor 50 spatially registers and optionally temporally registers the reconstructed MR and PET images. If created, the co-registered images are stored in a co-registration image memory 52. The images so registered are suitably displayed on a display device 54, rendered using suitable two-or three-dimensional rendering software, or otherwise processed.

A first cooling system 56 is provided to cool the gradient coils 16 to about 70° C. or less when the gradient coils are operating at maximum average power level. The detector array 30 is thermally proximate to the gradient coils 16 in that the gradient coils are close enough to the detector array 30 for heat from the gradient coils to transfer to the detector array 30. A second cooling system 58 is provided to cool the detector array 30 to about 30° C. or less, more desirably to about 20° C., in spite of the thermal proximity of the gradient coils 16.

Figure 2:
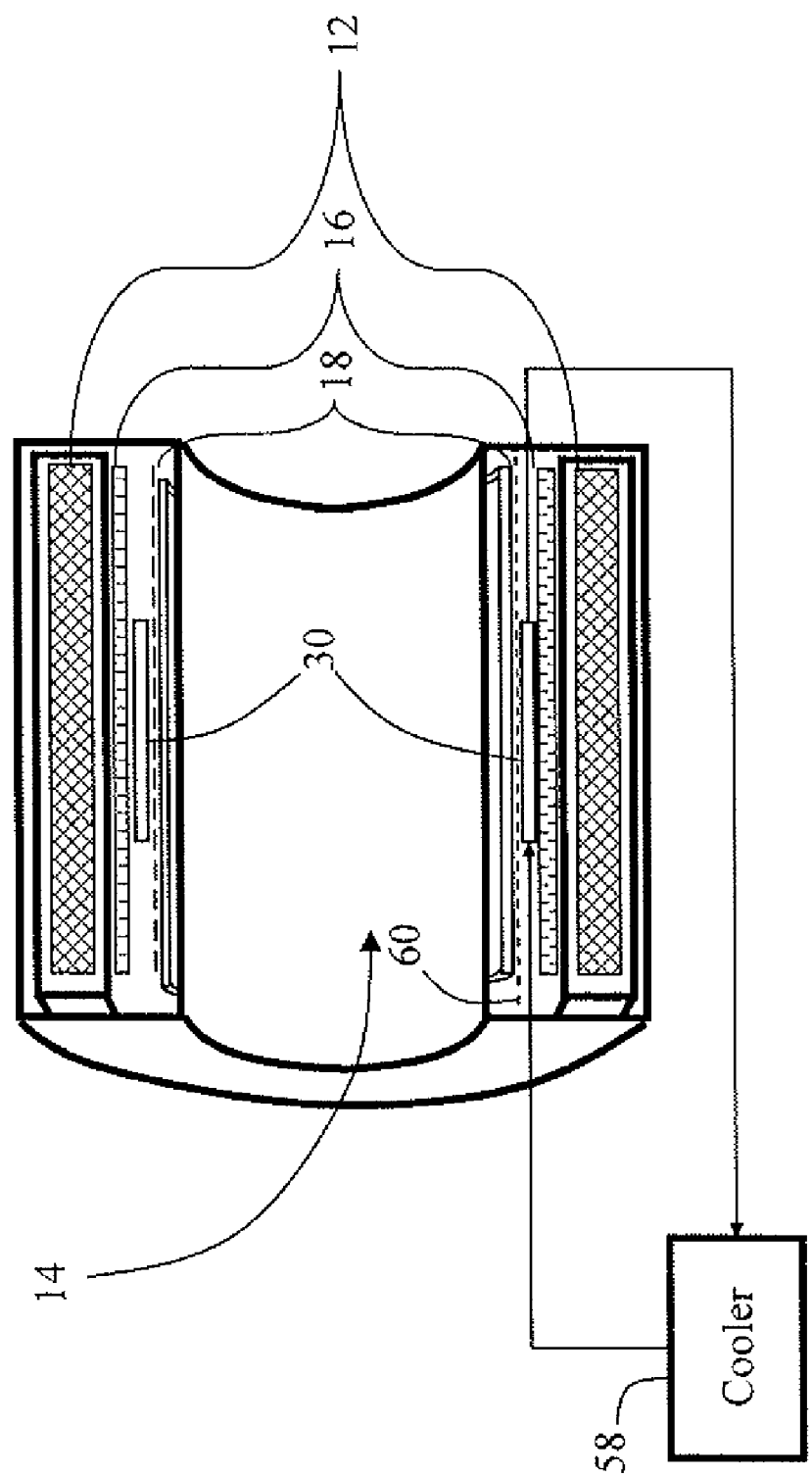
FIG. 2 is a cross sectional view of a bore of the scanner of FIG. 1, specifically showing a detector array between gradient and RF elements.
Figure 3:
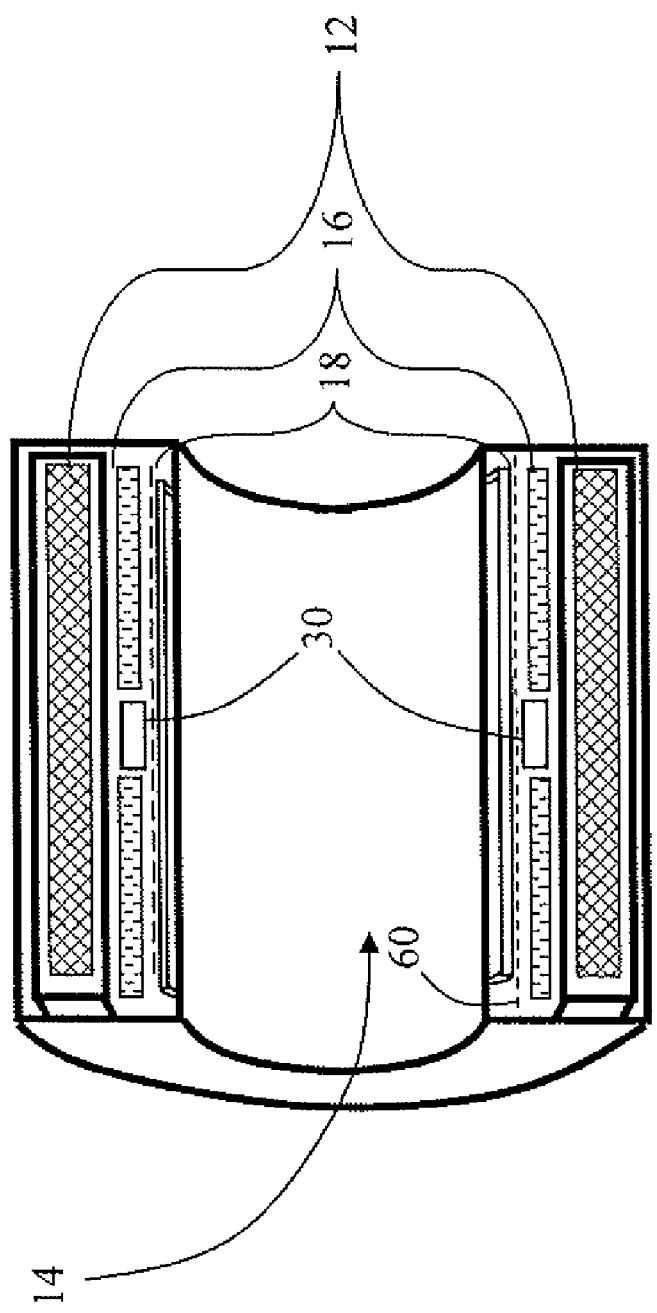
FIG. 3 is a cross sectional view of a bore of the scanner of FIG. 1, specifically showing a detector array between sections of a split gradient element.

With reference now to FIG. 2, an enlarged view of the imaging bore is provided. As mentioned previously, in one embodiment the detector array 30 extends 360° about the longitudinal axis of the imaging bore. The same can be said for the RF coil 18, the gradient coil 16, and the main magnet 12. In the embodiment of FIG. 2, the detector array 30 is located between the gradient coils 16 and an RF shield 60 for the RF coils 18. In a split gradient coil embodiment, as shown in FIG. 3, the detector array 30 can be located between portions of the gradient coil 16. Other locations for the detector array 30 have also been contemplated, such as a removable system that is inserted and removed from the bore as needed.

Figure 4:
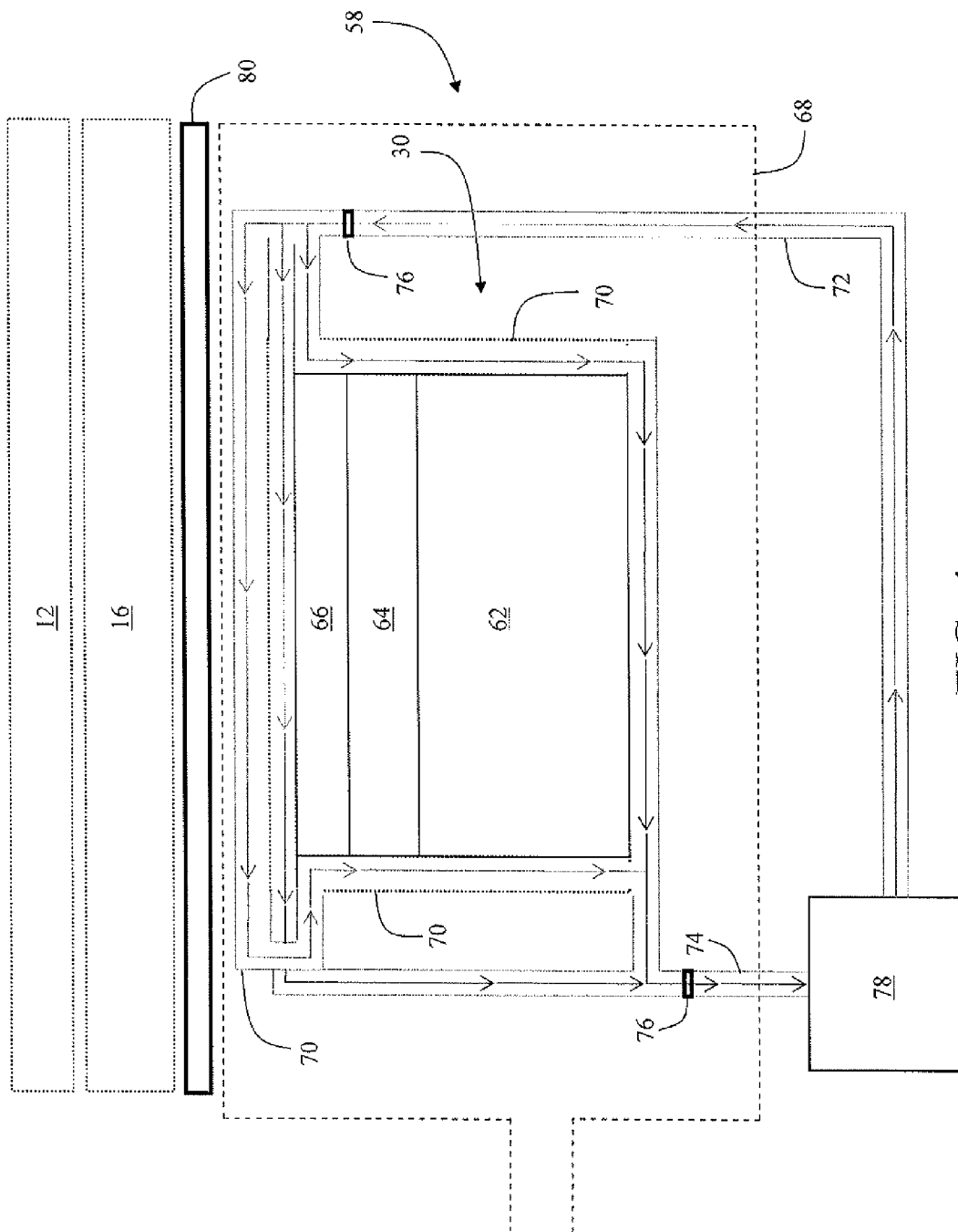
FIG. 4 is a diagrammatic illustration showing coolant flow directions through parallel flow pathways.

In either of the embodiments of FIGS. 2 and 3, the detector array 30 is in close proximity to the gradient coils 16. Active cooling keeps the detector array 30 from reaching thermal equilibrium with the gradient coil 16. In order to keep the detector array 30 at an acceptable operating temperature, the detector array 30 is provided with the closed circuit fluid cooling system 58, as shown in FIG. 4. FIG. 4 is a cross-sectional, close up view of the detector array 30. The detector array 30 includes, among other things, a scintillation layer 62, light detector elements 64, and associated electronics 66. The detector array 30 is all packaged within an RF shielded enclosure 68. The enclosure 68 prevents excitation pulses from the RF coils 18 and magnetic resonance signals from the imaging region 14 from creating false signals in the detector array 30. Also, the RF shielding prevents extraneous signals generated by the PET detector from being sensed by the MR RF coils. As mentioned before, all bore components, including the detector array 30 extend 360° around the bore.

The gradient coil temperatures range from room temperature, or slightly cooler, when not in operation, up to 70° C. during operation. The surrounding bore space likewise rises in temperature. In addition, the electronics 66 of the PET detector generate heat. Stray field energy from pulsed MR fields deposited in surrounding RF shielding material also generates additional heat. Thus, to prevent all these heat sources from adversely affecting the operation of the detector array, the fluid cooling system 58 is applied to the PET detector array 30. The cooling is applied to at least one surface of the detector. In one embodiment, the surface that is closest to the electronics and the gradient coils is fluid cooled and ends of the detector are insulated. In another embodiment, the circumferential surface and the end surfaces are all fluid cooled. In yet another embodiment, all accessible sides of the detector are fluid cooled, as shown in FIG. 4. The cooling fluid is directed through conductive channels 70. The channels 70 are made of a highly thermally conductive non-ferrous material, such as copper, aluminum, or stainless steel. As the detector array 30 itself is encased, the channels 70 that conduct heat away from the detectors are also enclosed by the RF shielding material 68. Different, magnetically inert material may be used outside of the RF shield 68. A feed channel 72 in particular may be made of or encased in a thermally insulating material, so that the coolant fluid does not draw heat away from components upstream of the detector array 30, thereby becoming less effective in removing heat from the detector array 30 itself. In one embodiment, the feed channel runs between the RF screen 60 and the gradient coils 16.

The cooling system is configured to provide efficient cooling of the PET detector 30 while conserving space. To this end, the cooling channels 70 are preferably thin, flat channels that are soldered or otherwise thermally connected directly to the circuitry 66. It is also preferable that the channels 70 be added so as to not increase the volume of the overall assembly, such as the channels 70 being arranged in complimentary fashions, such that facing circuit boards may fit together with little space wasted between them.

The cooling channels 70 about the detector array 30 are configured in such a manner to avoid creating closed conductive paths that would couple to the gradient fields. In one embodiment, this is accomplished by running the channels in zig-zag patterns primarily in an axial direction across the electronics carrying circuitry 66. When the sides are cooled, the cooling channels can extend radially. Avoiding annular channels reduces eddy current generation. Apertures in the RF enclosure 68 are made for the inlet path 72 and an outlet path 74. These apertures may be accomplished by using a waveguide. Dielectric breaks 76 in the cooling lines can be provided to break the channel conductive paths. A heat exchanger unit 78 provides flow and temperature control to the cooling fluid. The heat exchanger 78 can also chill the cooling fluid to below room temperature for more effective heat removal from the detector array 30. The heat exchanger 78 itself may be air cooled within the imaging room or an adjacent room. Another option would be to interface the heat exchanger 78 with a larger cooling system, such as a general cooling system of the building. Heat from the coolant could be transferred to another fluid pathway and out to a rooftop air conditioning compressor, or the like.

In one embodiment, pure or deionized water with minimal conductive properties which has desirable thermal transport characteristics, is the coolant fluid. The rate of flow of the coolant is proportional to the total electronics power dissipation and inversely proportional to the outlet-inlet temperature difference. The flow path may include parallel paths to minimize the accumulated temperature rise per circulation pass and effect an overall pressure drop. A single path might accommodate lower volume and flow capabilities with increased pressure drop, but portions of the detector array 30 at the end of the flow path may not be cooled as well as portions at the beginning of the flow path, meaning that the detector components further downstream might not be cooled to the same temperature as the upstream components. This may lead to, among other things, non-uniform image artifacts. Local provisions, such as heat sinks, can provide heat conduction paths away from the electronics 66 to the fluid channels 70. Alternatively, other coolant fluids, such as refrigerants, liquid nitrogen, forced air, or so forth could be used as the fluid coolant in the channels 70, and it is to be understood that "fluid" as used in the present application includes all of these. When using a colder than room temperature coolant, air flow can be provided through the bore to help prevent condensation.

In an alternate embodiment, a thermally conductive dielectric oil could be used as the coolant. In this embodiment, the dielectric coolant could come into direct contact with the electronics 66 and the detector elements instead of indirectly via the channel walls. In this immersion-cooling embodiment, the entire detector array 30 is encased in a fluid tight containment chamber, such as a cylindrical or elliptically profiled envelope. This method would obviate many fluid channels and heat sinks. Baffles in the containment chamber can be included to reduce the potential for non-uniform flow rates and hot spots.

In another alternate embodiment, Peltier cooling is used to cool the detector array 30. This could be used as a stand-alone method, or selective Peltier cooling could be used to cool trouble spots as a supplement to one or more of other methods described above. In the split gradient coil configuration of FIG. 3, it is advantageous for the cooler 56 and associated gradient cooling lines to be arranged to cool the split gradient coil from the inside to the outside, that is, from the region proximate to the gap of the split gradient coil to the outer extremities of the split gradient coil. This is advantageous because the gradient coil will then be coolest and have most stable temperature near the gap proximate to the detector array 30. Optionally, the cooling lines are also concentrated near the gap to further enhance gradient coil cooling efficiency nearest the detector array 30.

In another alternate embodiment, a common fluid cooling system is used to cool both the gradient coils 16 and the detector array 30. One advantage of this embodiment would be savings in both cost and space. A disadvantage, however, would lie in the fact that the temperature of the detector array 30 might be influenced by the gradient coil 16 temperature. The cooling fluid could cool the detector array to the lower temperature with the cooling fluid leaving the detector array going to cool or help cool the gradient coils 16. Also, separate circuits could be utilized, so that only a portion of the heat exchanger 78 is shared. In a dual cooling system environment, insulation 80 can be used, at least in part, to thermally isolate the gradient coils 16 from the detector array 30. This way, independent benchmarks can be set for each cooling system. With a combined cooling system, the gradient coils 16 could be cooled to the desired operating temperature of the detector array 30, which would take significantly more rigorous cooling, due to the greater thermal mass of the gradient coil 16. Another alternative is to have a combined cooling system with separate heat exchangers for the PET detector array and other elements that require cooling.

Figure 5:
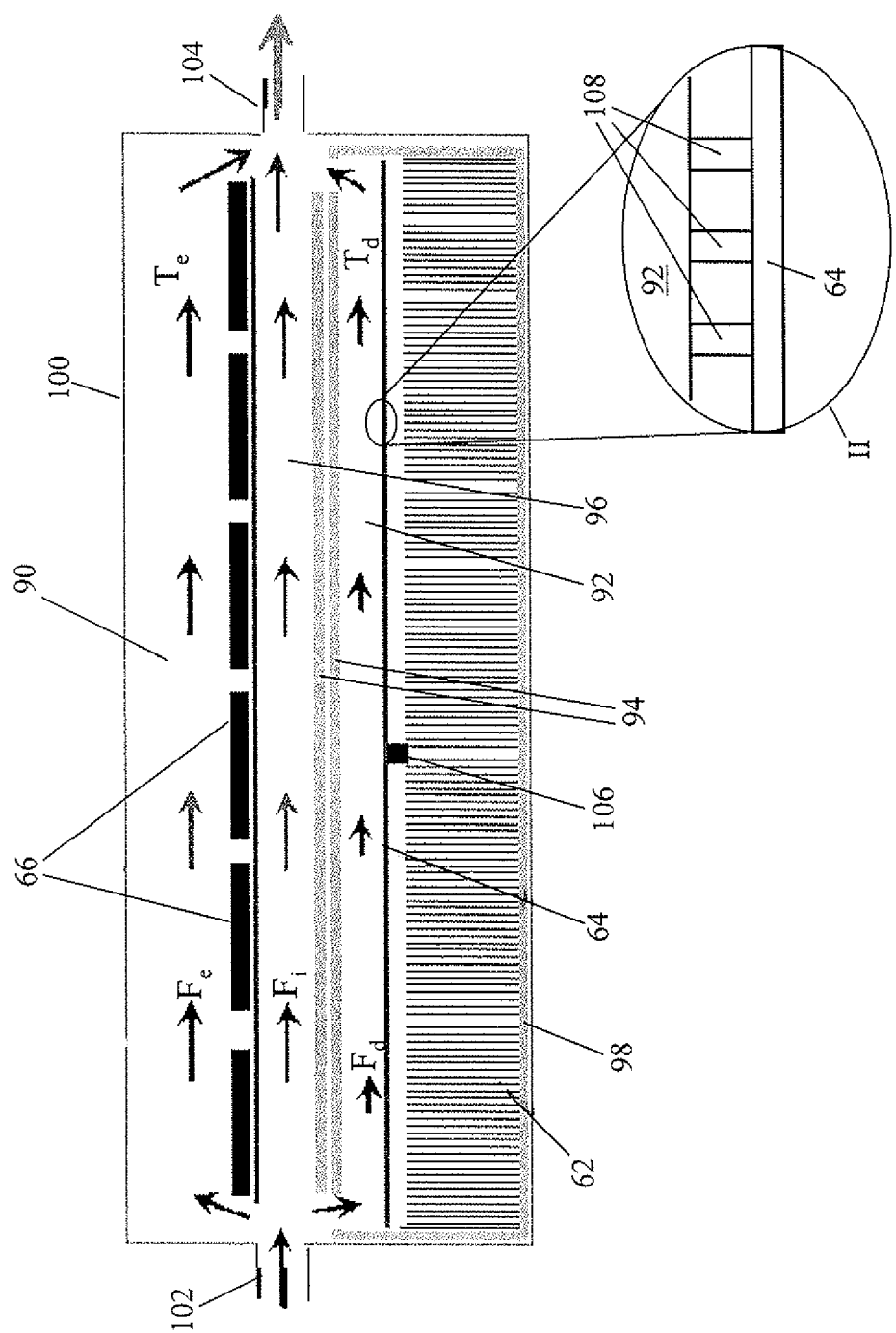
FIG. 5 is a diagrammatic illustration showing a detector cooling configuration providing differential cooling for the electronics and the light detectors.

With reference to FIG. 5, a detector cooling configuration is shown which provides differential cooling for the electronics 66 and the light detectors 64. The electronics may include, for example, time-to-digital converter (TDC) elements, analog-to-digital converter (ADC) elements, field-programmable gate array (FPGA) or other logic elements, low dropout (LDO) regulators, and so forth. These components generate a substantial amount of heat that is to be removed, but performance of the electronics 66 is generally not strongly correlated with temperature so long as the electronics 66 are maintained at a suitably low operating temperature, denoted $T_e$ in FIG. 5. Thus, a first cooling path 90 proximate to and cooling the electronics 66 is configured to provide a relatively high coolant fluid flow rate, denoted $F_e$ in FIG. 5, to provide high heat transfer.

The light detectors 64, such as silicon photomultiplier (SiPM) elements or photomultiplier tubes, have operating characteristics which are strongly temperature dependent. For example, for some SiPM detectors the gain increases by about 5-10% for each temperature increase of 1° C. However, the light detectors 64 generally output substantially less heat than the electronics 66. Thus, a second cooling path 92 proximate to and cooling the light detectors 64 is configured to provide a relatively lower flow rate, denoted $F_d$ in FIG. 5, which maintains the light detectors 66 at a precise temperature $T_d$ that does not vary substantially with time.

The electronics 66 and associated cooling path 90 on the one hand, and the light detectors 64 and associated cooling path 92, on the other hand, are arranged to be substantially thermally isolated from each other. This can be accomplished by passive thermal insulation material 94, such as an insulating dielectric material or an air gap, disposed between the electronics 66 and associated cooling path 90 on the one hand, and the light detectors 64 and associated cooling path 92, on the other hand. Additionally or alternatively, this can be accomplished by active thermal isolation provided by an isolation cooling path 96 flowing coolant fluid at a flow rate $F_i$.

The scintillators 62 generally do not require cooling. However, the scintillators 62 are arranged in close proximity to the light detectors 64, which must be kept at a stable temperature. Accordingly, in the embodiment of FIG. 5 additional passive thermal insulation material 98 is disposed around the scintillators 62 so that the passive insulation 94, 98 substantially contains a stable-temperature region including the light detectors 64. The detector temperature management system as a whole is suitably contained in an outer container 100 surrounding the detector module, with a coolant fluid inlet 102 at one side distributing coolant fluid flows $F_e$, $F_d$, $F_i$ into the cooling paths 90, 92, 96, and a coolant fluid outlet 104 at the opposite side draining the coolant fluid flows $F_e$, $F_d$, $F_i$ from the detector module. The differing relative flow rates for the coolant fluid flows $F_e$, $F_d$, $F_i$ are suitably defined by fluid flow resistances (or, equivalently, fluid flow conductances) of the corresponding cooling paths 90, 92, 96. Optionally, one or more temperature sensors 106 are disposed to measure the temperature of the light detectors 64, and the flow into the inlet 102 (or, alternatively, out of the outlet 104) is controlled to maintain the temperature sensor 106 at a desired temperature reading. Alternatively, the temperature sensor can be arranged to measure the temperature $T_d$ of the coolant fluid path 92 that cools the light detectors 64, as this temperature $T_d$ should be close to the temperature of the light detectors 64. Controlling coolant fluid flow based on the detector temperature (or, approximately, based on the temperature $T_d$) is advantageous because this is the critical temperature that should be maintained stable.

Although not illustrated, it is also contemplated to provide active, e.g. externally controllable or temperature feedback-controlled, valving to adjust the relative flow rates $F_e$, $F_d$, $F_i$ into the cooling paths 90, 92, 96. Additionally, although not shown it is contemplated to provide passive thermal insulation material surrounding the electronics 66 and associated flow path 90.

In another contemplated variation, The cooling of the module as shown in FIG. 5 is modified by using a counter-current setup for each individual plane to reduce temperature gradients within the module. This can be accomplished by placing the inlet 102 and outlet 104 on the same side of the detector module. It is expected that use of a counter-current setup will reduce temperature gradients by 1-2 orders of magnitude which can be expected to improve temperature stability. Alternatively, the cooling can be cascaded as the actual heat generated by the light detectors 64 is estimated to be 100 times lower than the heat generated by the electronics 66. In either a counter-current or cascaded design, it is advantageous to first cool the light detectors 64 and then the electronics 66, for example by flowing the coolant first through the cooling path 92 proximate to the light detectors 64 and then through the cooling path 90 proximate to the electronics 66. This arrangement of coolant fluid flow promotes a precise and lower temperature $T_d$ proximate to the light detectors 64 as compared with the temperature $T_e$ proximate to the electronics 66. The temperature $T_e$ of the electronics 66 is where most of the heat is dissipated, but the electronics temperature does not have to be as accurate and it can be cooled by the coolant fluid after passing proximate to the light detectors 64.

As yet another variation on the design of FIG. 5, with reference to inset II shown in FIG. 5 micro-Peltier elements 108 can provide an active, controllable thermal resistance between the cooling path 92 and the light detectors 64. As an example, standard Peltier elements are suitably based on Bismuth Telluride ($Bi_2Te_3$) and Bismuth Selenide ($Bi_2Se_3$). An arrangement similar to that used to cool semiconductors using silicon-based Peltier elements (described, for example, in Mathews et al., U.S. Pat. No. 6,800,933 which is incorporated herein by reference) can be used, in which micro-Peltier devices are disposed in non-sensitive areas on top of semiconductor-on-insulator (SOI) substrates used in the light detectors 64. It is possible to implement these structures also in a separate device mounted on back of the light detectors 64. In this approach, local temperature gradients can be tuned and controlled to within about 0.1° C. or less, so as to ensure exact and constant temperature at each light detector element. In these embodiments, the temperature of the cooling medium does not have to be as low as the light detector temperature, eliminating condensation and expensive cooling of the medium below room temperature.

The radiation detector system of FIG. 5 employs coolant fluid. The coolant fluid may be, for example, deionized water, forced air, a refrigerant, or so forth. In such embodiments, the inlet and outlet 102, 104 are suitably connected with external supply and return lines (e.g., lines 72, 74 of FIG. 4), for example using a permanent connection such as a soldered connection, or a detachable connector such a threaded coupling or a quick-disconnect connection.

Figure 6:
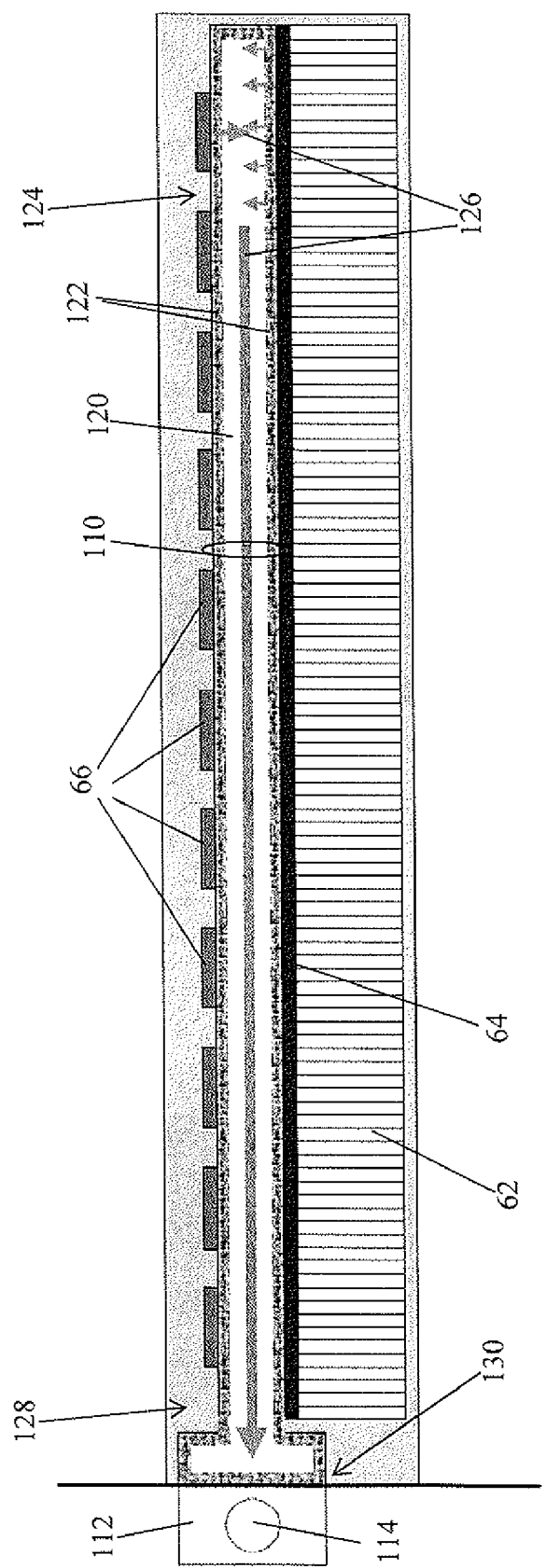
FIG. 6 is a diagrammatic illustration showing a detector cooling configuration employing heat pipes.
Figure 7:
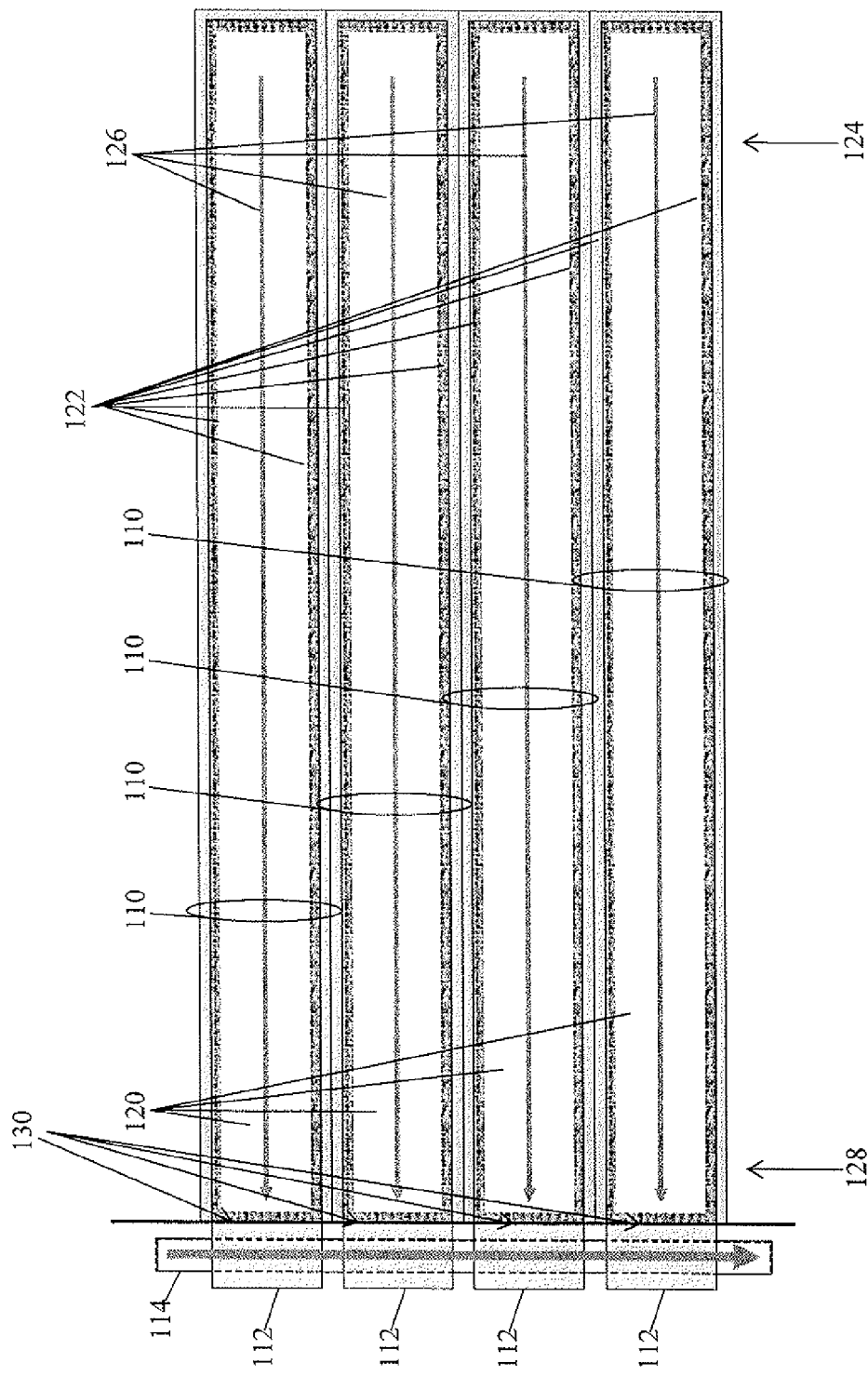
FIG. 7 is a diagrammatic illustration showing a planar view of the array of heat pipes of the detector cooling configuration of FIG. 6, along with the connection with fluid-cooled heat sinks.

With reference to FIGS. 6 and 7, in another embodiment one or more heat pipes, such as an illustrated array of parallel linear heat pipes 110, are used to provide heat transfer from the components of a radiation detector module to one or more heat sinks 112 made of a thermally conductive material such as a thermally conductive ceramic, aluminum oxide, aluminum nitride, or so forth. A thermally conductive metal such as copper can also be used for the heat sinks 112, but should be laminated or otherwise configured to suppress eddy current formation. Optionally, a cooling fluid pathway 114 passes through the heat sinks 112 to provide removal of heat transferred into the heat sinks 112 by the heat pipes 110.

Each heat pipe 110 includes a sealed interior volume 120 containing at least one working fluid, such as water, a solvent such as alcohol, or so forth, or a mixture of working fluids. A wicking material or structure 122 consisting of a porous material, grooves formed on the surface, or another material or structure supportive of capillary or wicking action is disposed on interior surfaces of the interior volume 120.

In operation, the working fluid vaporizes proximate to the end 124 of the heat pipe 110 distal from the heat sink 112, or at other "hot spots" along the heat pipe 110. A heat of vaporization is transferred from the hot spot to the vaporized working fluid, which is diagrammatically indicated by arrows 126. The vaporized working fluid 126 moves toward the heat sink 112 due to vapor concentration gradients. The vaporized working fluid 126 condenses proximate to the end 128 of the heat pipe 110 proximate to the heat sink 112. Condensation of the working fluid at the proximate end 128 transfers a heat of condensation from the condensing working fluid to the heat sink 112. The condensed working fluid is drawn back toward the distal end of the heat pipe 110 by capillary or wicking action associated with the wicking material or structure 122. When the working fluid vaporizes again at a hot spot, the heat transfer cycle is complete. Advantageously, the condensed fluid return by capillary forces in the wicking material or structure 122 is independent of spatial position of the heat pipe 110.

For use in a hybrid system including an MR component, the heat pipes 110 are preferably made of non-magnetic and electrically non-conductive materials, such as high thermal conductivity ceramics such as aluminum nitride or alumina. If metallic or other electrically conductive materials are used, they should be laminated, arranged as a composite in an electrically non-conductive matrix material, or otherwise configured to suppress eddy current formation. As illustrated in FIGS. 6 and 7, the array of heat pipes 110 is generally planar and is disposed between the light detectors 64 and the associated electronics 66 to cool both. Since the vaporized working fluid 126 is transported rapidly, there is an intrinsic temperature isolation between the relatively hotter electronics 66 and the relatively cooler light detectors 64.

Advantageously, the connection of the heat pipes 110 and the heat sinks 112 can be by thermally conductive surface contacts 130, optionally enhanced by a pressure fitting, threaded connection, or so forth, and does not entail flow of cooling fluid between the heat sinks 112 and the heat pipes 110 and hence does not include fluid connections therebetween. Advantageously, the heat pipes 110 are permanently sealed units that are not opened when the radiation detector module is mounted or dismounted.

Another advantage is that the temperature at the exterior of the heat pipes 110 is substantially controlled by the vaporization temperature of the working fluid and is substantially constant along the heat pipes 110. The vaporization temperature is a function of the cooling medium or media.

Figure 8:
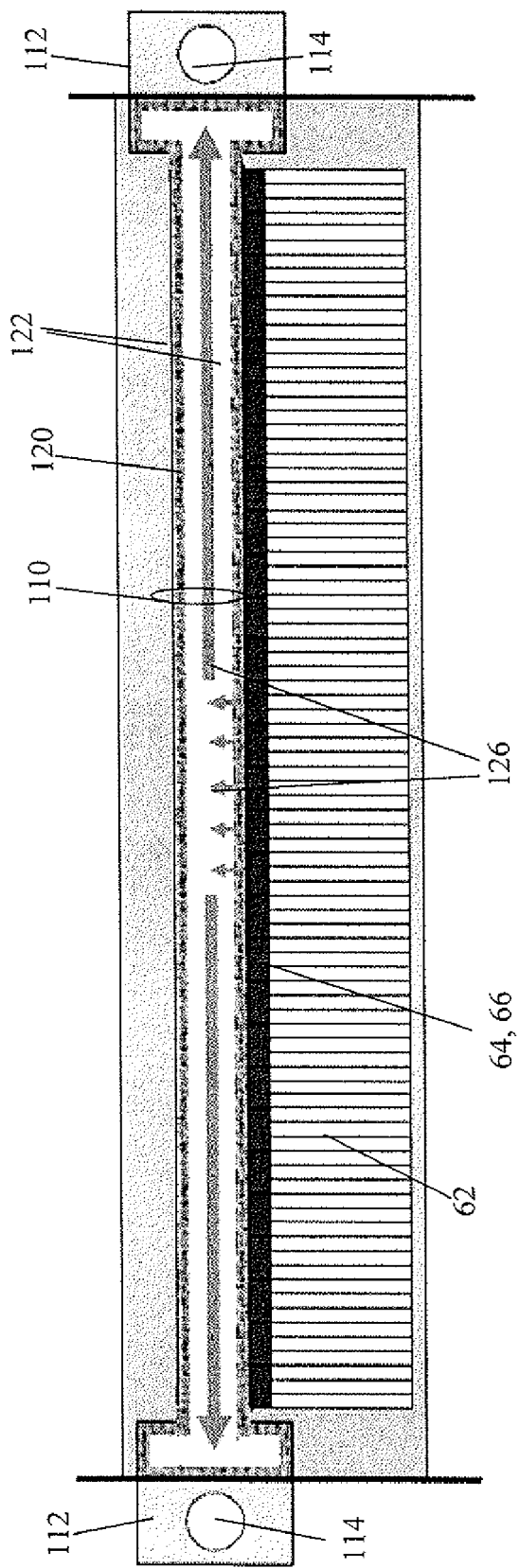
FIG. 8 is a diagrammatic illustration showing a detector cooling configuration similar to that of FIG. 6, but including thermal coupling to heat sinks at both ends of the heat pipes.

With reference to FIG. 8, to further reduce temperature gradients, it is contemplated to have each heat pipe 110 in thermal communication with more than one heat sink 112, such as having heat sinks 112 at both ends of the heat pipe 110 as shown in FIG. 8. It is also contemplated to arrange an array of crossing linear heat pipes, or to use a generally planar heat pipe, or to employ other heat pipe geometries to enhance heat removal and temperature stability.

The embodiment of FIG. 8 also includes the light detectors 64 and the electronics 66 integrated as a single layer, for example monolithically integrated on or in a single common layer of silicon substrate material. See, for example, WO 2006/111883 A2 (published Oct. 26, 2006 and incorporated herein by reference in its entirety) which relates to a digital silicon photomultiplier (SiPM) for time-of-flight PET in which the digital SiPM includes a detector arrays layer and a buried CMOS digital processing circuitry layer monolithically formed in or on a common silicon substrate. In the embodiment of FIG. 8, the heat pipe 110 has wicking material or structure 122 disposed on the interior surfaces of the interior volume 120 both distal from and proximate to the cooled elements 64, 66. However, since in the embodiment of FIG. 8 the cooled elements 64, 66 are disposed together on one side of the heat pipe 110, it is contemplated to dispose the wicking material or structure only on the interior surface proximate to the cooled elements 64, 66.

As another variation, although in the embodiments illustrated in FIGS. 6-8 the heat pipes 110 are in direct contact or in close proximity to the cooled elements 64, 66, in other embodiments the heat pipes may be disposed in a block of thermally conductive ceramic material or electrically non-conductive composite material that in turn is in intimate thermal contact with the cooled elements 64, 66.

Although described in the illustrative context of a hybrid imaging system incorporating magnetic resonance imaging, it is to be appreciated that the radiation detector module cooling configurations disclosed with reference to FIGS. 4-8 are also contemplated for use in other imaging systems employing radiation detectors, such as stand-alone PET imaging systems, PET/CT (computed tomography) imaging systems, gamma cameras, and so forth.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A diagnostic imaging apparatus comprising:
   a magnetic resonance portion that includes:
      a main magnetic coil assembly for generating a main magnetic field in an imaging region of the apparatus;
      a gradient coil assembly for overlaying gradient magnetic fields on the main magnetic field;
      an RF coil assembly for at least transmitting RF signals into the imaging region;
   a positron emission tomography portion including:
      a fluid cooled detector array for detecting radiation indicative of nuclear decay events, the detector array having a fluid cooling system other than a cooling system of the gradient coil assembly and other than a cooling system of the main magnetic coil assembly, the detector array being thermally proximate to the gradient coil assembly and maintained at a lower temperature than the thermally proximate gradient coil assembly by fluid cooling of the fluid cooled detector array;
   at least one reconstruction processor for producing an image representation from detected signals originating from the imaging region; and
   a display for displaying the reconstructed image representation.

2. The diagnostic imaging apparatus as set forth in claim 1, further including:
   an RF shield enclosure that encases the detector array and shields the array from RF signals.

3. The diagnostic imaging apparatus as set forth in claim 1 wherein the detector cooling system includes a cylindrical envelope.

4. The diagnostic imaging apparatus as set forth in claim 1, wherein the detector cooling system includes a plurality of channels extending generally parallel to the main magnetic field.

5. The diagnostic imaging apparatus as set forth in claim 1, wherein the detector cooling system encases the detector array, the detector array being immersed in thermally conductive dielectric oil.

6. The diagnostic imaging apparatus as set forth in claim 1, wherein the detector array includes:
   a generally annular array of radiation detectors extending around the imaging region;
   detector electronics disposed between the generally annular array and the gradient coil assembly;
   cooling fluid paths defined between the detector electronics and the gradient coil array.

7. The diagnostic imaging apparatus as set forth in claim 6, further including:
   one or more heat pipes in thermal communication with the radiation detectors to provide a stable temperature for the radiation detectors.

8. A diagnostic imaging apparatus comprising:
   a magnetic resonance portion that includes:
      a main magnetic coil assembly for generating a main magnetic field in an imaging region of the apparatus;
      a gradient coil assembly for overlaying gradient magnetic fields on the main magnetic field;
      an RF coil assembly for at least transmitting RF signals into the imaging region;
   a positron emission tomography portion including:
      a fluid cooled detector array for detecting radiation indicative of nuclear decay events, the detector array being thermally proximate to the gradient coil assembly and maintained at a lower temperature than the thermally proximate gradient coil assembly by a fluid coolant loop of the fluid cooled detector array wherein the coolant loop includes a plurality of channels extending generally parallel to the main magnetic field and at least one dielectric break in the coolant loop that disrupts eddy current paths;

at least one reconstruction processor for producing an image representation from detected signals originating from the imaging region; and a display for displaying the reconstructed image representation.

9. A diagnostic imaging apparatus comprising:

a magnetic resonance portion that includes:

a main magnetic coil assembly for generating a main magnetic field in an imaging region of the apparatus;

a gradient coil assembly for overlaying gradient magnetic fields on the main magnetic field;

an RF coil assembly for at least transmitting RF signals into the imaging region;

a positron emission tomography portion including:

a fluid cooled detector array for detecting radiation indicative of nuclear decay events, the detector array being thermally proximate to the gradient coil assembly and maintained at a lower temperature than the thermally proximate gradient coil assembly by fluid cooling of the fluid cooled detector array, the detector array including a generally annular array of radiation detectors extending around the imaging region, detector electronics disposed between the generally annular array and the gradient coil assembly, and cooling fluid paths defined between the detector electronics and the gradient coil array wherein the cooling fluid paths include a first cooling path arranged to cool the detector electronics and a second cooling path arranged to cool the detector elements;

at least one reconstruction processor for producing an image representation from detected signals originating from the imaging region; and a display for displaying the reconstructed image representation.

10. The diagnostic imaging apparatus as set forth in claim 9, wherein first and second coolant paths are driven by a common inlet and a common outlet in one of (i) a parallel arrangement, (ii) a counter-current arrangement, or (iii) a cascaded arrangement in which coolant fluid passes through the second cooling path and then into the first cooling path.

11. The diagnostic imaging apparatus as set forth in claim 9, further comprising:

a temperature sensor operatively coupled with at least one of the second coolant path and the detector elements, a fluid flow through the second coolant path being controlled to maintain a stable temperature as indicated by the temperature sensor.

12. The diagnostic imaging apparatus as set forth in claim 9, further comprising:

micro-Peltier elements defining a thermal resistance between the second cooling path and the detector elements.

13. A method of diagnostic imaging comprising:

detecting the magnetic resonance using a magnetic resonance scanner;

detecting radiation indicative of radioactive decay events with a detector array in thermal proximity with the magnetic resonance scanner;

cooling the detector array with a fluid coolant by pumping the coolant through multiple channels adjacent to the detector array;

reconstructing at least one of the detected magnetic resonance and the radiation into an image representation of the subject; and displaying the image representation.

14. The method as set forth in claim 13, further including:

thermally isolating at least one portion of a coolant loop from gradient coils that overlay the gradient fields.

15. The method as set forth in claim 13, wherein the cooling comprises:

cooling electronics of the detector array with a first cooling path through which fluid coolant flows; and cooling radiation detectors of the detector array with a second cooling path different from the first cooling path through which fluid coolant flows;

wherein the first and second cooling paths both receive fluid coolant directly or indirectly from a common fluid coolant inlet.

16. The method as set forth in claim 15, wherein the first and second cooling paths are cascaded with fluid coolant flowing through the second coolant path to cool the radiation detectors and then through the first coolant path to cool the electronics.

17. The method as set forth in claim 13, wherein the cooling further comprises:

disposing a portion of the fluid coolant in a sealed heat pipe also containing a wicking material or structure, the sealed heat pipe operatively coupled with the detector array and with at least one heat sink such that vaporization/condensation cycling of the fluid coolant in the sealed heat pipe transfers heat from the detector array to the heat sink.

18. A method of diagnostic imaging comprising:

detecting the magnetic resonance using a magnetic resonance scanner;

detecting radiation indicative of radioactive decay events with a detector array in thermal proximity with the magnetic resonance scanner;

cooling the detector array with a fluid coolant;

cooling detector electronics of the detector array with the fluid coolant;

thermally isolating the detector array from a gradient coil assembly that overlays the gradient fields on the main magnetic field;

reconstructing at least one of the detected magnetic resonance and the radiation into an image representation of the subject; and displaying the image representation.

19. The method as set forth in claim 18, wherein the cooling further comprises:

disposing at least a portion of the fluid coolant in a sealed heat pipe also containing a wicking material or structure, the sealed heat pipe operatively coupled with the detector array and with at least one heat sink such that vaporization/condensation cycling of the fluid coolant in the sealed heat pipe transfers heat from the detector array to the heat sink.

* * * * *